(12) United States Patent
Capote et al.

(10) Patent No.: US 7,531,809 B2
(45) Date of Patent: May 12, 2009

(54) GAMMA RAY DETECTOR MODULES

(75) Inventors: M. Albert Capote, Carlsbad, CA (US); Howard A. Lenos, Murrieta, CA (US)

(73) Assignee: Creative Electron, Inc., San Marcos, CA (US)

( * ) Notice: Subject to any disclaimer, the term of this patent is extended or adjusted under 35 U.S.C. 154(b) by 16 days.

(21) Appl. No.: 11/783,505

(22) Filed: Apr. 10, 2007

(65) Prior Publication Data

US 2007/0235656 A1    Oct. 11, 2007

Related U.S. Application Data

(63) Continuation of application No. 10/725,442, filed on Dec. 3, 2003, now Pat. No. 7,223,981.

(60) Provisional application No. 60/430,659, filed on Dec. 4, 2002.

(51) Int. Cl.
*H01L 25/00* (2006.01)
(52) U.S. Cl. .................................. 250/370.13
(58) Field of Classification Search ............ 250/370.13; 438/67
See application file for complete search history.

(56) References Cited

U.S. PATENT DOCUMENTS

| | | | |
|---|---|---|---|
| 5,245,191 A | 9/1993 | Barber et al. | |
| 5,365,088 A | 11/1994 | Myrosznyk | |
| 5,786,597 A | 7/1998 | Lingren et al. | |
| 5,812,191 A | 9/1998 | Orava et al. | |
| 5,847,398 A | 12/1998 | Shahar et al. | |
| 5,905,264 A | 5/1999 | Shahar et al. | |
| 5,952,646 A | 9/1999 | Spartiotis | |
| 5,955,733 A | 9/1999 | Orava et al. | |
| 5,985,043 A | 11/1999 | Zhou et al. | |
| 5,985,056 A | 11/1999 | McCay et al. | |

(Continued)

OTHER PUBLICATIONS

George A. Riley, Steven Bornstein; Prepublication Abstract Conference Information; Apr. 18-20, 2001; 1 page.

(Continued)

*Primary Examiner*—David P Porta
*Assistant Examiner*—Djura Malevic
(74) *Attorney, Agent, or Firm*—The Nath Law Group; Jerald L. Meyer; Jonathan A. Kidney

(57) ABSTRACT

A radiation detector assembly has a semiconductor detector array substrate of CdZnTe or CdTe, having a plurality of detector cell pads on a first surface thereof, the pads having a contact metallization and a solder barrier metallization. An interposer card has planar dimensions no larger than planar dimensions of the semiconductor detector array substrate, a plurality of interconnect pads on a first surface thereof, at least one readout semiconductor chip and at least one connector on a second surface thereof, each having planar dimensions no larger than the planar dimensions of the interposer card. Solder columns extend from contacts on the interposer first surface to the plurality of pads on the semiconductor detector array substrate first surface, the solder columns having at least one solder having a melting point or liquidus less than 120 degrees C. An encapsulant is disposed between the interposer circuit card first surface and the semiconductor detector array substrate first surface, encapsulating the solder columns, the encapsulant curing at a temperature no greater than 120 degrees C.

35 Claims, 4 Drawing Sheets

U.S. PATENT DOCUMENTS

| | | | |
|---|---|---|---|
| 6,011,264 A | 1/2000 | Lachish et al. | |
| 6,017,634 A | 1/2000 | Capote et al. | |
| 6,034,373 A | 3/2000 | Shahar et al. | |
| 6,035,013 A | 3/2000 | Orava et al. | |
| 6,046,068 A | 4/2000 | Orava et al. | |
| 6,121,689 A * | 9/2000 | Capote et al. | 257/783 |
| 6,132,646 A * | 10/2000 | Zhou et al. | 252/512 |
| 6,163,028 A | 12/2000 | Orava et al. | |
| 6,188,089 B1 | 2/2001 | Spartiotis | |
| 6,207,944 B1 | 3/2001 | Spartiotis et al. | |
| 6,215,123 B1 | 4/2001 | Orava et al. | |
| 6,242,745 B1 | 6/2001 | Berlad et al. | |
| 6,248,990 B1 | 6/2001 | Pyyhtia et al. | |
| 6,252,217 B1 | 6/2001 | Pyyhtia et al. | |
| 6,255,638 B1 | 7/2001 | Eraluoto et al. | |
| 6,285,029 B1 | 9/2001 | Shahar et al. | |
| 6,297,560 B1 | 10/2001 | Capote et al. | |
| 6,312,974 B1 | 11/2001 | Wu et al. | |
| 6,323,475 B1 | 11/2001 | Spartiotis | |
| 6,335,571 B1 | 1/2002 | Capote et al. | |
| 6,340,812 B1 | 1/2002 | Izumi et al. | |
| 6,340,818 B1 | 1/2002 | Izumi et al. | |
| 6,355,923 B2 | 3/2002 | Pyyhtia et al. | |
| 6,380,528 B1 | 4/2002 | Pyyhtia et al. | |
| 6,388,258 B1 | 5/2002 | Berlad et al. | |
| 6,399,426 B1 | 6/2002 | Capote et al. | |
| 6,403,964 B1 | 6/2002 | Kyyhkynen | |
| 6,408,110 B2 | 6/2002 | Schulman | |
| 6,465,790 B1 | 10/2002 | Monnet et al. | |
| 6,518,677 B1 | 2/2003 | Capote et al. | |
| 6,566,234 B1 | 5/2003 | Capote et al. | |
| 6,579,748 B1 | 6/2003 | Okuno et al. | |
| 6,657,200 B2 | 12/2003 | Nygard et al. | |
| 6,765,213 B2 | 7/2004 | Shahar et al. | |
| 6,774,493 B2 | 8/2004 | Capote et al. | |
| 6,946,660 B2 | 9/2005 | El-Hanany et al. | |
| 2001/0001562 A1 | 5/2001 | Orava et al. | |
| 2002/0011657 A1 | 1/2002 | Saito | |
| 2002/0025914 A1 | 2/2002 | Appel et al. | |
| 2002/0089595 A1 | 7/2002 | Orava et al. | |
| 2002/0092970 A1 | 7/2002 | Pyyhtia et al. | |
| 2002/0125438 A1 | 9/2002 | Pyyhtia et al. | |
| 2002/0163055 A1 | 11/2002 | Thomas | |
| 2003/0010924 A1 | 1/2003 | El-Hanany | |
| 2003/0229986 A1 | 12/2003 | Su et al. | |
| 2006/0011852 A1 | 1/2006 | El-Hanany et al. | |

OTHER PUBLICATIONS

Francois Lebrun; ISGRI: a camera for invisible light; Jan. 8, 2003.
O. Peyret, C. Mestais, L. Verger; Vers les gamma-caméras à semi-conducteurs; 1999 vol. 5, p. No. 129.
P.F. Boloser, T. Narita, J.A. Jenkins, M. Perrin, R. Murryah and J.E. Grindlay; Balloon Flight Background Measurement with Actively-Shielded Planar and Imaging CZT Detectors; Oct. 3, 2001; 1 page.
www.evproducts.com/cztconfig.html; EV Products & Services Products, CZT Detector Configurations; 1 page. Jan. 6, 2003.

* cited by examiner

Array of Arrays

GAMMA RAY DETECTOR MODULES

RELATED APPLICATIONS

This application is a continuation of U.S. patent application Ser. No. 10/725,442, filed Dec. 3, 2003, now U.S. Pat. No. 7,223,981 currently pending, which itself claims the benefit of U.S. Provisional Patent Application No. 60/430,659, filed Dec. 4, 2002. The contents of these U.S. patent applications Ser. Nos. 10/725,442, and 60/430,659, are hereby incorporated by reference in their entirety.

STATEMENT OF GOVERNMENT RIGHTS

This invention was funded with U.S. Government support under Contract No. NNG04CA02C awarded by National Aeronautics and Space Administration (NASA). The U.S. Government has certain rights in the invention.

FIELD OF THE INVENTION

The invention relates to x-ray or gamma ray detection devices and gamma ray imaging devices comprising a semiconductor detector substrate including a plurality of detector elements interconnected to an interposer card. The interposer card is in turn interconnected to a readout device (e.g. a semiconductor readout device) that is mounted on the interposer card, the readout device including a corresponding plurality of readout cells. The interposer card further includes one or more connectors for interconnecting the device to power, ground and other signal processing electronics.

BACKGROUND OF THE INVENTION

A semiconductor detector substrate used for detection of x-rays and gamma rays may comprise cadmium zinc telluride (CdZnTe otherwise known as CZT) or cadmium telluride (CdTe). The amplitude of the electrical pulses derived from such detectors are indicative of the energy of the gamma rays absorbed by the detector substrate. Such semiconductor detector substrates comprise a plurality of detector cells (e.g., pixel cells) defined by an array of metal contacts on one side of the semiconductor detector substrate. The readout device can comprise a corresponding plurality of readout circuits each corresponding to each of the detector cells in the array. In the prior art, a semiconductor readout substrate is interconnected to the detector substrate with individual pixel cells being directly connected to their corresponding readout circuits by means of conductive bumps. Such a detector-readout assembly or module may then become part of a larger system used for creating images in two or more dimensions from x-rays or gamma rays being emitted by an object to be imaged. Alternately, the detector-readout assembly may be used singly, or in combination with other similar assemblies, to detect the presence of x- or gamma radiation photons and their energies.

Devices of this type have many important potential uses in biological and clinical imaging applications, environmental remediation systems, nuclear radioisotope security systems, and space satellites. In medical/biological applications, these array detectors have applications in planar imaging, SPECT imaging systems, and as surgical probes. Some possible applications are mammography, clinical cardiology, in vivo auto radiography, neuroscience studies, and lymphatic system imaging. In nuclear medicine, arrays of CZT detectors can create superior images of injected radiotracers, thus aiding in removal of cancerous tissue while minimizing damage to healthy tissue. They can also be used for medical applications involving the exposure of a patient to ionizing radiation. Such applications require high radiation absorption characteristics for the detector substrate of the imaging device. Such high radiation absorption characteristics can be provided by materials using high Z element, such as found in CdZnTe or CdTe. Furthermore, various medical applications require high spatial resolution. For example, mammography requires the ability to observe microcalcifications which can be under 100 microns or even under 50 microns in size. The stringent requirements imposed on imaging devices require the use of small resolution elements, or pixel cells, with a large array of such cells being needed to generate an image of a useful size.

Outside of biological and clinical uses, for environmental monitoring and remediation, as well as nuclear radioisotope security, gamma array detection can provide detailed information on radioisotopes present and their relative abundances. It also can be combined with an X-ray source to analyze the composition of non-radioactive isotopes through use of X-ray fluorescence, as for example, in examining the contents of a closed box or suitcase. In nuclear non-proliferation, the imaging of x-ray and gamma sources at a distance has the potential to detect illicit transport of radioactive materials. In astrophysics, CZT detector arrays are currently being employed in studies of distant gamma-burst sources.

An important step in the fabrication of such imaging devices is the interconnection of the semiconductor detector substrate array to the readout device and the subsequent interconnection of this assembly to other image processing electronics, electrical power and ground sources. This involves the electrical interconnection of the semiconductor detector substrate array cells to corresponding readout device cells in a one-to-one correspondence, and furthermore, electrical interconnection of the readout device to external electronics.

Typically, prior art imaging devices, known as hybrids, such as those described in U.S. Pat. No. 5,245,191, EP-A-0 571, 135, and EP-A-0 577 187, employ indium bumps for bump-bonding the semiconductor detector substrate directly to a semiconductor readout substrate. Generally in the prior art, indium bumps are grown using evaporation on the detector metal contacts that define the pixel cells and the corresponding readout device cells of a semiconductor readout substrate. Subsequently, the two different parts are brought together, aligned, and the corresponding bumps are merged. For indium bumps, a cold welding technique is achieved by heating the substrates at 70-120 degrees C. and applying mechanical pressure. For detectors comprising heat sensitive materials, such as CZT and CdTe, the use of indium bumps is advantageous in that the interconnection process can be carried out at temperatures below 120 degrees C.

U.S. Pat. No. 5,952,646, which is incorporated herein in its entirety, describes an alternate method in which low temperature tin-lead-based solder bumps, e.g. eutectic tin-lead-bismuth alloy (melt point 97 degrees C.), are employed instead of the more generally used indium bumps. The soldering of such bumps can also be accomplished at temperatures below 120 degrees C. The limitation of using such low-temperature solder is that the solder joints formed are relatively weak and subject to cracking and breaking. This can occur during normal use, as for example, when a detector assembly is subjected to thermal cycles in the operating environment, or when an assembly is dropped. Therefore, the use of low-temperature solders alone, as proposed in the prior art, is not practical for many applications.

Another issue is that creation of large detectors requires a package that allows detectors modules to be abutted together into large tiled arrays, without dead space in between detector modules. For example, U.S. Pat. No. 5,786,597, which is incorporated herein in its entirety, describes an alternative detector module configuration for such an abuttable detector module. In this patent, each detector module comprises a plurality of detection elements mounted to a circuit carrier, as shown in FIG. 1. The detection module comprises an integrated circuit mounted on a ceramic or plastic carrier 214. The circuit carrier 214 houses the readout ICs and passive components, and provides interconnections from the ICs to the detection elements 212 and to a module motherboard (not shown). The detection elements 212 are formed by an array of electrodes on the lower surface of the CZT detector 210. The prior art detection module 206 shown in FIG. 1 is assembled with thin plates positioned on both the top and bottom surfaces of the detector 210. The upper plate (not shown) provides a means for applying a bias voltage to the detection modules 206, insulates the bias voltage from the detector housing, and provides physical protection for the detector substrate. The upper plate is designed to allow the gamma rays emitted from the object 102 to penetrate the plate and to be absorbed in the detection elements 212. A lower plate 230 provides the means for connecting the detector elements 212 to the circuit carrier 214. The lower plate 230 includes a plurality of contact pads 232 that correspond in position to the positions of the detection elements 212. The plurality of contact pads 232 provide electrical connection for each detection element to a corresponding input contact pad on the top surface of the circuit carrier 214. The contact pads 232 are electrically isolated from each other. In the prior art, conductive epoxy or indium bump bonds are used to bond the electrodes of these detection elements 212 to contact pads on the lower plate 230 and the contacts of the lower plate to input contact pads of the circuit carrier 214. Thus, the detector inputs are connected to the readout ICs in the circuit carrier 214 via the upper surface of the carrier 214 and the lower plate 230. Other inputs and outputs are connected to the ICs via a plurality of pins 240 on the bottom surface of the circuit carrier 214. The plurality of pins 240 are designed to mate with insertion or socket connectors affixed to a motherboard. The configuration of the detection module allows the module 206 to be abutted on all four sides by other detectors on the motherboard. Therefore, such a prior art detection module 206 advantageously provides a modular element which can be combined in a number of ways with other detection modules 206 to produce a large imager tiled array having a desired configuration.

One problem with prior art. approaches that use of indium bump bonding to bond the various elements electrically is that the indium bump bonding process necessitates that the surfaces of the parts to be bonded be flat to very high tolerances. This is expensive to achieve and difficult to accomplish repeatedly in a production process. Also, if a conductive adhesive or indium bump bonding is used, a lower plate is required that is thick enough to mechanically isolate the semiconductor detector FIG. 1 210 from the carrier 214. Without such a lower plate, the stresses induced in the assembly's bonds may be capable of breaking such bonds and causing electrical failure of the element interconnects. Such stress can be caused by thermal cycling due to temperature fluctuations present under normal use, or due to mechanical shock, as when the assembly is dropped. However, the inclusion of a thick lower plate involves additional fabrication cost as well as increases the profile, or thickness, of the overall detector module. Low profile modules are desirable in many applications, e.g. modules employed in portable handheld gamma ray detection electronics.

Therefore there is a need to devise an improved method of bonding gamma ray array detectors, such as CZT and CdTe, to a readout device in such a way that it can withstand the stresses encountered in normal use. There is also a need to create lower cost abuttable detector modules having low profiles.

SUMMARY OF THE INVENTION

The invention relates to x-ray or gamma ray detection devices as well as x-ray or gamma ray imaging devices comprising a semiconductor detector substrate including a plurality of detector elements each of which is soldered to an interposer card pad, wherein the solder joints are encapsulated in a dielectric to increase their mechanical strength and provide mechanical stability to the detector-interposer card solder joints. The interposer card pads are in turn interconnected to the inputs of a readout device, such as a semiconductor readout device, that is mounted on the interposer card, the device including a corresponding plurality of readout cells. The interposer card further comprises one or more connectors for interconnecting the device to power, ground and other signal processing electronics.

The instant invention describes an improved approach to configure semiconductor gamma ray detector modules employing an interposer card rather than the conventional direct bump hybridization used in the prior art of U.S. Pat. No. 5,952,646 or the lower plate approach of U.S. Pat. No. 5,786,597. The novel scheme incorporates a unique combination of prior art flip-chip and multichip module technologies in combination with novel low-temperature flip-chip bonding materials and processes. This results in detector "tiles" containing integrated readout devices and connectors in low-profile modules that can be inserted into a motherboard, as illustrated in FIGS. 2, 3 and 4. The benefit of the inventive configuration is that it is capable of withstanding the stress of normal use. These modules employ new fabrication and packaging methods encompassing the following innovative elements:

1. Solder bump flip-chip interconnections for assembly of the semiconductor detector to the interposer. The solder bumps are encapsulated in a solid resin that reduces the stresses on the solder joints, providing a practical assembly that has superior reliability compared to the prior art. Such encapsulating resins, called underfills, are normally used to encapsulate solder bumps in prior art flip-chip assemblies that employ conventional high-temperature solders. The novel feature of the inventive encapsulation is that, unlike prior flip chip underfill resins, the encapsulant must be designed to cure completely at temperatures below 120 degrees C. in order to avoid damage to the heat-sensitive semiconductor detector. Typically such encapsulants are designed to be cured at 165 degrees C. or higher in order to achieve a high modulus and a low expansion coefficient. Such requirements are not as important in CZT detector assemblies as they are in conventional flip chips.

2. By employing the inventive interposer and low-temperature encapsulated solder joint approach, it is possible to eliminate the lower plate of the prior art. This reduces the number of assembly operations as well as provides a low profile module.

An interposer is a high-density printed circuit that interconnects a detector array to one or more readout chips or devices. It also interconnects the detector to a connector for interconnecting the detector module's I/O, power and ground circuits to signal processing electronics and power sources on a motherboard or backplane. The interposer eliminates the need to interconnect silicon directly to the detector, allowing the detector modules to be abutted together on all sides. The interposer provides a redistribution layer for the detector elements so that they can be interconnected to a semiconductor readout array of any configuration. The readout chip is generally designed to be smaller than the detector array, so the interposer fans out the inputs from the readout chip to each pixel element on the detector. The interposer has sufficient area available for attaching a connector. The readout chip may be either solder bumped or wire bonded to the interposer.

DETAILED DESCRIPTION OF THE INVENTION

Figure 1:
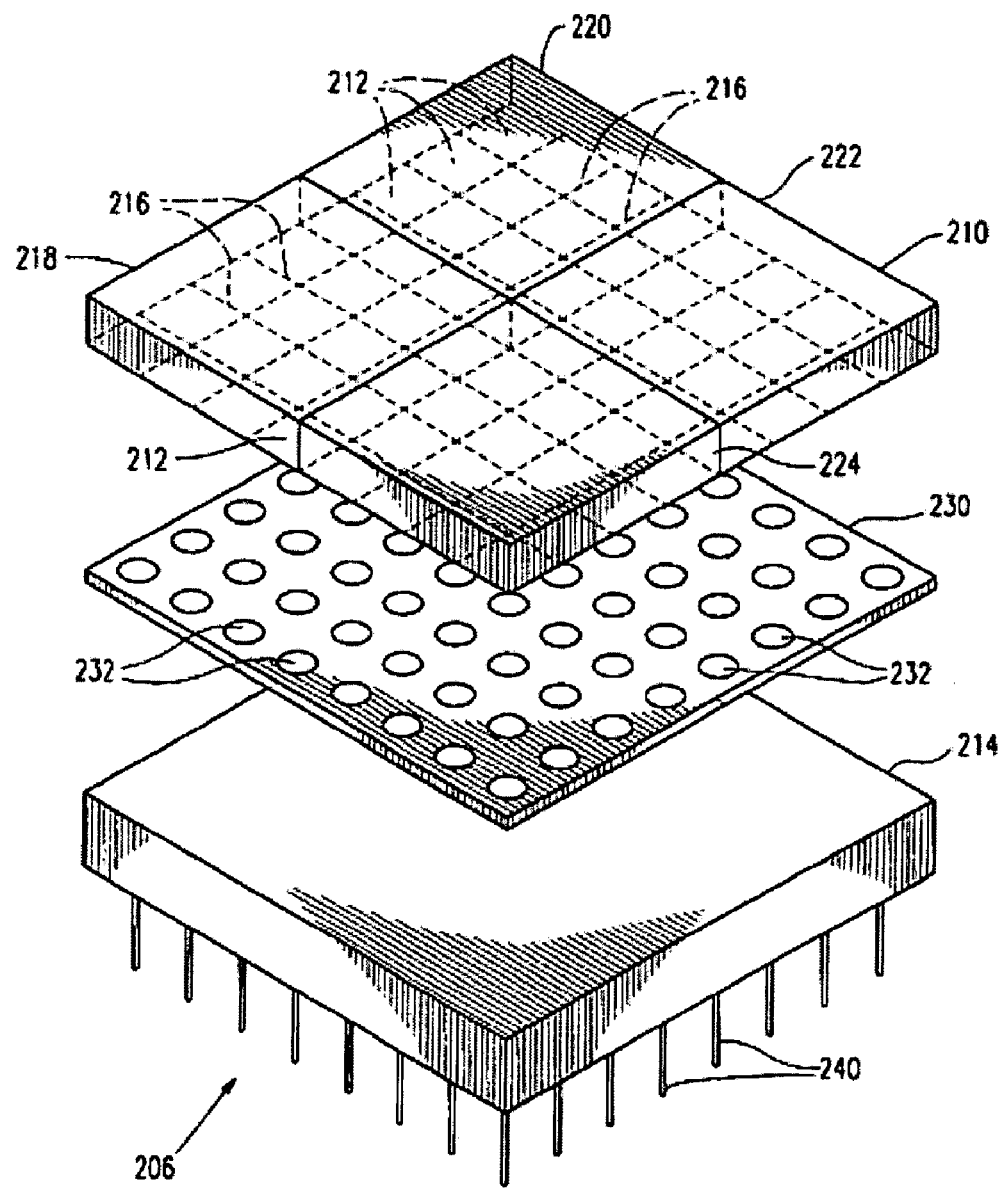
FIG. 1 is an illustration showing a prior art detector assembly that is designed to be abuttable on all four sides
Figure 2:
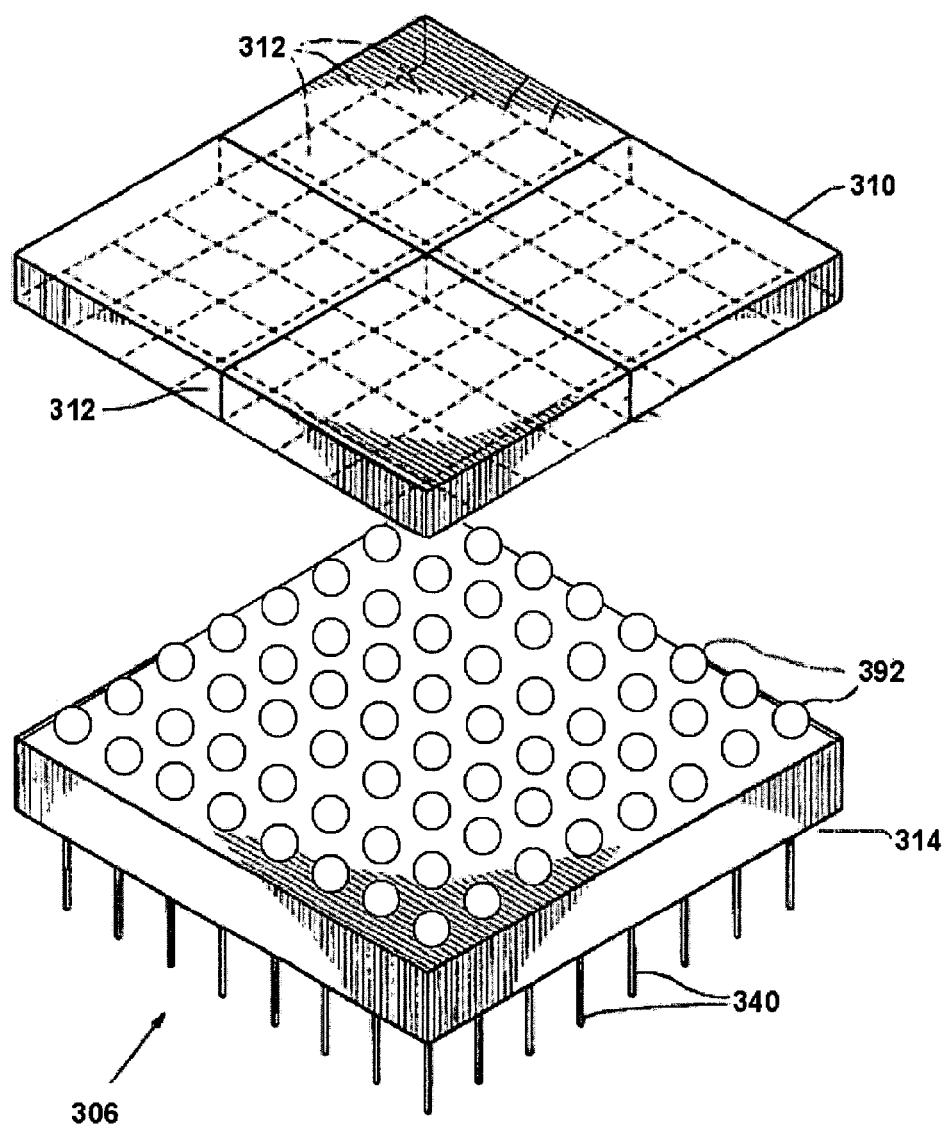
FIG. 2 illustrates one embodiment of the instant invention, a detector module in cross section

FIG. 2 shows a perspective view of a detection module 306 of the present invention. As depicted in FIG. 2, the detection module 306 comprises an integrated circuit mounted within a ceramic or plastic interposer circuit card 314. The semiconductor detector 310 of the detection module 306 includes an array of detection elements 312. A plurality of solder bumps 392 provide electrical connection for each detection element 312 to a corresponding input contact pad on the top surface of the interposer 314. The solder bumps 392 are electrically isolated from each other by a solid encapsulating material (not shown).

In the preferred embodiment of the present invention, the detection elements 312 comprise a plurality of cadmium-zinc-telluride (CZT) gamma-ray detection areas formed on the lower surface of detector 310. The detectors can alternatively comprise cadmium telluride, or other x-ray or gamma-ray sensitive materials. The detectors convert x-rays and gamma rays into electrical charge pulses. The amplitude of the electrical pulses are indicative of the energy of the gamma rays absorbed. As is known in the art, CZT crystals provide good energy and spatial resolution, can operate at room temperature, and can be manufactured in a variety of dimensions.

The interposer 314 houses the readout devices, optional passive components, and other support electronics. It provides interconnections for these to the detection elements 312 and to the module motherboard (not shown) through a connector 340, such as the pin grid array shown. The interposer 314 preferably comprises a ceramic or polymer laminate printed circuit.

The detector elements 312 are formed by an array of electrodes on the lower surface of the detector 310. The electrodes of detector 310 comprise a contact metal layer directly on the detector surface, followed by barrier metallization layers, and optionally topped by a solderability layer. Typical contact metals include platinum, gold, aluminum, or other metal. The preferred contact layer comprises platinum or gold. The barrier layers are meant to protect the contact layer and detector from damage by the solder and typically comprise Ni, Ni/V, Ti/W or Cu and may include interface metals, such as titanium or chromium. The preferred barrier metal comprises a thin Ti layer of about 10 to 100 nanometers followed by a thicker Ni layer of about 50 to 500 nanometers. The solderability layer is meant to enhance the solder wetting during assembly and may comprise gold, silver, platinum, palladium, tin or some other solderable metal or alternately, an organic solderability promoter such as Entek Cu-106A available from Enthone.

In the instant invention, solder is used to bond the detector electrodes 312 to the input contact pads of the interposer 314. The solder must comprise a low-temperature component that wets the contact pads at low temperature so that the assembly bonding can be carried out without heating the detector above 120 degrees C. for any extended period of time. There are several ways to achieve this. The three principal ones are:

1. Employ solder bumps composed entirely of a eutectic solder having a melting point below 120 degrees C., e.g. BiIn (m.p. 72 degrees C.), BiInSn (m.p. 79 degrees C.), and InSnCd (m.p. 93 degrees C.), BiPbSn (m.p. 97 degrees C.)

2. Employ non-eutectic solder bumps with a solidus temperature below 120 degrees C.

3. Employ solder balls of high melting point solder and a solder cap of 1 or 2 above. The cap can be applied on either the solder ball or the opposite pad to be bonded.

Solder bumps can be created on either each contact pad of the interposer or each electrode of the detector. There are several well-known methods known in the art to accomplish this:

1. Sequential vacuum evaporation of the metals in the desired composition through a mask onto the pads or electrodes, followed by reflow to create the alloy.

2. Sequential electroplating of the metals in the desired composition through a mask onto the pads or electrodes, followed by reflow to create the alloy.

3. Printing of solder paste of the desired composition through a stencil or mask onto the pads or electrodes, followed by reflow to solidify the paste.

4. Application of a solder ball of the desired size and composition onto the pads or electrodes, followed by reflow to attach the ball.

Each of these methods has particular benefits depending on the type of solder employed and the final assembly to be constructed. When the electrode array spacing is large (greater than about 0.5 millimeter), the preferred method is to apply low-melting point eutectic solder or low liquidus non-eutectic solder balls to the interposer. Bonding is then accomplished by aligning and contacting the interposer card bumps to the electrodes of the detector, followed by heating up to 120 degrees C. to wet the solder ball onto the electrode. Preferred is the use of a solder flux that promotes wetting of the electrode surfaces by the molten solder.

When the electrode spacing is small (less than about 0.5 millimeter) the preferred method is to print the solder bumps on the interposer contact pads with a high melting point solder paste through a mask, followed by reflow. Subsequently, low melting point solder paste is coated through a stencil then reflowed onto the detector electrodes. Bonding is then accomplished by aligning and contacting the interposer card solder bumps to the low melting point solder coating the electrodes of the detector, followed by solder reflow of the low-melting point solder only. Preferred is the use of a solder flux that promotes wetting of the surfaces by the molten solder. These two approaches have the benefit that both produce assemblies with good standoff separation between the parts and avoids complete collapse of the solder bump. The separation creates columnar solder joints that are compliant under stress and thus are less likely to crack or break apart.

The solder joints formed in this manner are nevertheless not strong enough to endure subsequent stresses in normal use. To increase the integrity of the bonds, encapsulation is preferred. This can be accomplished by applying a liquid underfill encapsulant to the gap between the detector and interposer after assembly, followed by curing, as is known in the art. However, unlike the prior art, it is necessary to employ an especially designed encapsulating resin that completely cures at a temperature not exceeding 120 degrees C., and preferably mush lower. Alternately, the preferred approach is to employ an encapsulating polymer flux that cures at the same time that the solder is reflowed. Such fluxes are described in U.S. Pat. Nos. 5,985,043 and 6,017,634, which are incorporated herein in their entirety. Such prior art fluxes can be formulated to provide the necessary flux activity at low melting point solder temperatures and also cure fully at about 90 degrees C.

Referring to FIG. 2, in the instant invention, the detector electrodes 312 are connected to the readout devices on the interposer 314 via the solder joints 392. Other inputs and outputs are connected to the interposer via a connector on the bottom surface of the interposer 314. The connector may comprise a plurality of pins 340 or a plurality of contact pads. The plurality of pins 340 or pads are designed to mate with connectors affixed to a motherboard. Preferably, the connector comprises a land grid array on the interposer. Such an array is connected to the motherboard by means of a low profile spring array connector. An example of such a connector is the Microconn® connector of Teledyne Interconnects (San Diego, Calif.).

Figure 3:
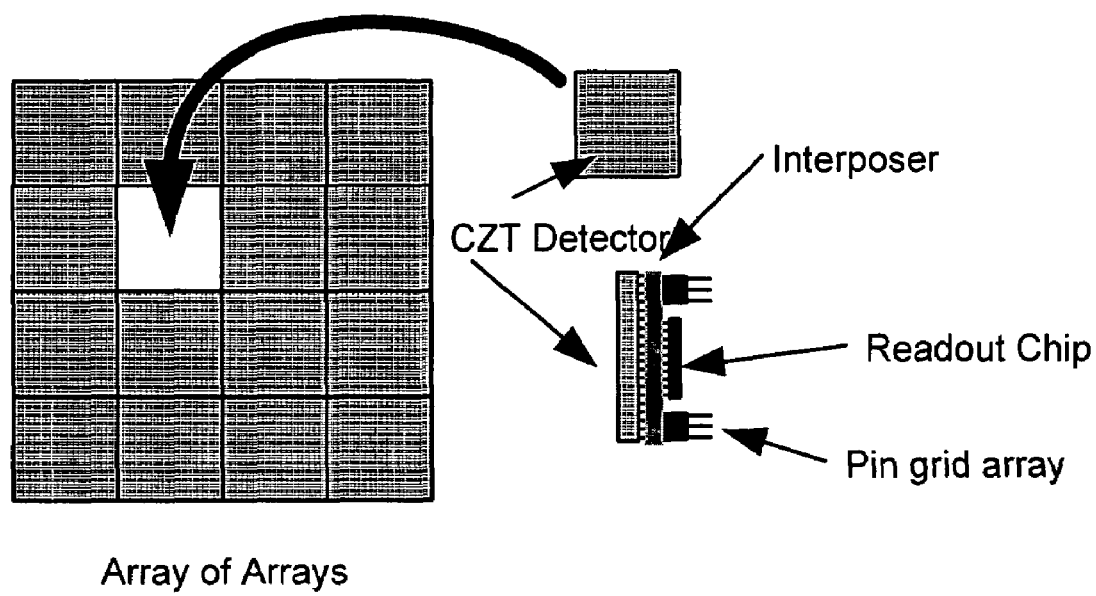
FIG. 3 illustrates the abutment of detector modules into a tiled array of modules without dead space.

The configuration of the inventive detector module advantageously allows the detector to be abutted on all four sides (FIG. 3). Therefore, the present detector module advantageously provides the desired modular element that can be combined in a number of ways with other modules to produce a large detector array having a desired configuration. The use of columnar solder joints and the encapsulating resin results in a reliable low-profile assembly.

Figure 4:
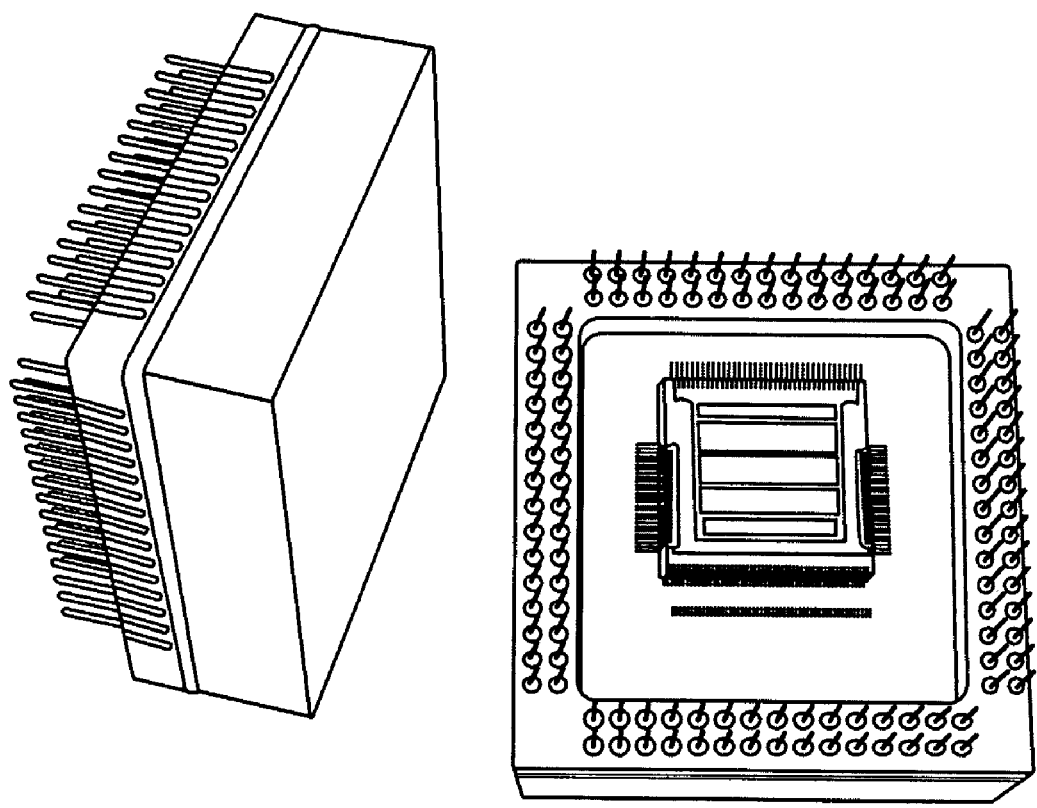
FIG. 4 is a photo of two CZT detector modules according to the described invention

Here by way of example are steps employed in the creation of the module of FIG. 4:

Prior to assembly, the electrodes on the detector were prepared to receive solder. First, platinum contacts, about 100 nanometers thick, were applied by vacuum evaporation through a mask. An additional barrier of Ti/Ni/Au in thicknesses, about 50/100/50 nanometers thick, was applied in the same manner over the Pt to effect a solderable interface and barrier.

A readout ASIC chip was bonded to the interposer with epoxy. Wirebonds were used to connect the chip to the interposer. A peripheral two-row pin grid connector was then soldered to the interposer in a conventional soldering reflow process. The chip was then encapsulated in a commercial silicone glob-top encapsulant. The finished subassembly was tested at this point to ascertain that all connections have been made before attachment of the detector. Bumping of the interposer assembly was next. InSnCd eutectic solder balls were applied to the interposer contact pads and reflowed, with the aid of common rosin flux. The flux residue was then cleaned off in alcohol.

The assembly of the detector to the interposer was done last. Assembly was done on a die-bonding machine with a positional accuracy of at most 10% of the pad size. A split-image optical microscope that allows simultaneous viewing of the detector array pads and the solder posts on the interposer is used on the die bonder. The bumps on the interposer were aligned to the detector's electrodes by viewing through the split image optics. After alignment, the optics are removed and a drop of a polymer flux, described in U.S. Pat. No. 6,017,634, was applied to the detector's surface. This was done by a volumetric syringe that applies the required flux quantity in a tightly controlled way.

The two parts—the detector and the interposer—were brought together at the solder balls. The mated parts were solder-reflowed in a conventional multizone convection solder-reflow oven with a temperature profile that peaked at 120 degrees C. for approximately 60 seconds. Reflow soldering was performed at low temperature, just hot enough to melt the low-melting point solder on the pads. Simultaneously, the polymer flux underfill began to harden to a solid. Subsequently, the encapsulant polymer flux was post-cured at 90 degrees C. for 4 hours for complete solidification.

In accordance with a first aspect of the invention, there is provided a device for detection or imaging X-ray or gamma radiation, the device comprising a semiconductor substrate including an array of detector cells which generate charge in response to incident radiation, a corresponding readout semiconductor substrate of planar dimensions no larger than the planar dimensions of the semiconductor detector substrate, said readout semiconductor substrate including an array of readout cells, said readout cell being connected to corresponding detector cells by means of an interposer circuit card, also of planar dimensions no larger than the dimensions of the semiconductor detector substrate, that is interconnected to said detector semiconductor substrate on one side and said readout semiconductor substrate on the other solder joints comprising a solder with a melting point or liquidus less than 120 degrees C. and and encapsulant fully encapsulating said solder joints, said encapsulant curing at a temperature no greater than 120 degrees C.

In accordance with another aspect of the invention, there is provided a semiconductor detector substrate, including an array of detector cells which generate charge in response to incident radiation, a corresponding interposer card of planar dimensions no larger than the dimensions of the semiconductor detector substrate, solder joints comprising a solder with a melting point or liquidus less than 120 degrees C. between the interposer card and the detector substrate and and encapsulant fully encapsulating said solder joints, said encapsulant curing at a temperature no greater than 120 degrees C.

said interposer card comprising a printed circuit with an array of connecting pads, each pad corresponding to a detector cell on the semiconductor detector substrate at least one readout semiconductor chip of planar dimensions no larger than the dimensions of the interposer card, and at least one connector.

In accordance with yet another aspect of the invention, there is provided radiation detector assembly, comprising:

a semiconductor detector array substrate having a plurality of detector cell pads on a first surface thereof said pads comprising a contact metallization and a solder barrier metallization an interposer card having a plurality of interconnect pads on a first surface thereof, and at least one readout semiconductor chip, and at least one connector on a second surface thereof each, of planar dimensions no larger than the planar dimensions of the interposer card an encapsulant between the interposer circuit card first surface and the semiconductor detector array substrate first surface, the encapsulant having a plurality of holes therethrough filled with solder that extends from contacts on the interposer surface aligned with the holes through the encapsulant to the plurality of pads on the semiconductor detector array substrate said solder having a melting point or liquidus less than 120 degrees C. and said encapsulant curing at a temperature no greater than 120 degrees C.

Furthermore, said encapsulants may comprise a polymer flux.

In accordance with yet another aspect of the invention, there is provided a method for making a detector array assembly that comprises the steps of:

providing an interposer card having
a plurality of discrete solder bumps on a first surface thereof
and at least one readout semiconductor chip, and at least one connector on a second surface thereof each, of planar dimensions no larger than the planar dimensions of the interposer card providing a semiconductor detector array substrate having a plurality of metallized detector cell pads on a first surface thereof, at least one pad corresponding to at least one solder bump on said interposer card, said pads comprising a contact metallization and a solder barrier metallization disposing an encapsulant comprising a fluxing agent between the interposer card and the semiconductor detector array substrate; and attaching the interposer card to the semiconductor detector array substrate to form a combined unit wherein the solder bumps face towards and are aligned with their corresponding pads, such that there exists encapsulant at least between the conductive bumps between said interposer card and said detector substrate wherein said solder joints comprise a solder with a melting point or liquidus less than 120 degrees C. and said encapsulant cures at a temperature no greater than 120 degrees C.

In accordance with yet another aspect of the invention, there is provided a method for making a detector array assembly that comprises the steps of:

providing an interposer card having a plurality of discrete solder bumps on a first surface thereof and at least one readout semiconductor chip, and at least one connector on a second surface thereof each, of planar dimensions no larger than the planar dimensions of the interposer card providing a semiconductor detector array substrate having a plurality of metallized detector cell pads on a first surface thereof, at least one pad corresponding to at least one conductive bump on said interposer card, said pads comprising a contact metallization and a solder barrier metallization attaching the interposer card to the semiconductor detector array substrate to form a combined unit wherein the solder bumps face towards and are aligned with their corresponding pads, and;

disposing an encapsulant between the interposer card and the semiconductor detector array substrate; such that there exists encapsulant at least between the conductive bumps between said interposer card and said detector substrate wherein said solder joints comprise a solder with a melting point or liquidus less than 120 degrees C. and said encapsulant cures at a temperature no greater than 120 degrees C.

In either of these methods of assembly, the encapsulant may comprise a polymer flux portion. The encapsulant may also comprise a polymer portion having a filler that reduces its effective expansion coefficient. The encapsulant may include a first portion comprising a solid or a thick liquid, partially or fully cured, e.g. an epoxy resin. The encapsulant may also be applied to either the interposer card or to the semiconductor detector array substrate, or to both parts prior to attaching them to form a combined unit. The method may comprise applying heat so that the solder bumps are interconnected to the detector cell pads while simultaneously the encapsulant hardens. The preferred method comprises heating the combined unit up to a temperature that melts the solder and simultaneously softens at least a portion of the encapsulant to a low viscosity maintaining it at a low viscosity while the solder wets to form a metallurgical electrical interconnection at each bump and pad. The preferred method further comprises allowing the melted solder and encapsulant materials to harden.

In yet another embodiment, the encapsulant includes at least one portion that can be remelted sufficiently to allow separation of the assembly after it has been assembled and the materials hardened. This would allow for repair of the assembly without damage to one or both components. To accomplish this the encapsulant may comprise a thermoplastic that softens below 120 degrees Celsius.

The invention claimed is:

1. An x-radiation or gamma radiation detector assembly, comprising:

a semiconductor detector array substrate, comprising CdZnTe or CdTe, having a plurality of detector cell pads on a first surface thereof, said pads comprising a solderable metallization;

a connection substrate with circuit traces, having a plurality of interconnect pads on a first surface thereof, solder joints that extend from contacts on the connection substrate first surface to the plurality of metallized pads on the semiconductor detector array substrate first surface, said solder joints comprising at least one solder having a melting point or liquidus less than 120 degrees C.; and a dielectric encapsulant, said solder joints encapsulated therein to increase their mechanical strength and provide mechanical stability to the assembly between said connection substrate first surface and the semiconductor detector array substrate first surface.

2. The assembly of claim 1, wherein the encapsulant at least partially cures at the same time as a process of reflowing of said solder having a melting point or liquidus less than 120 degrees C.

3. The assembly of claim 1, the assembly comprising an encapsulating polymer solder flux that at least partially cures at the same time as a process of reflowing of said solder having a melting point or liquidus less than 120 degrees C.

4. The assembly of claim 1, wherein the connection substrate with circuit traces comprises a ceramic or polymeric connection substrate.

5. The assembly of claim 4, wherein said connection substrate comprises one or more connectors for interconnecting the device to power, ground and other signal processing electronics.

6. The assembly of claim 1 wherein the encapsulant comprises a polymer that cures at temperatures below 120 degrees C. in order to avoid damage to said substrate comprising CdZnTe or CdTe.

7. The assembly of claim 1 wherein said detector cell pads further comprise a contact metallization.

8. The assembly of claim 1 wherein said detector cell pads further comprise a solderable contact metallization and a solder barrier metallization.

9. The assembly of claim 1, wherein
the semiconductor detector array substrate includes an array of detection elements,
wherein the connection substrate with circuit traces comprises a printed circuit card at which a plurality of solder bumps provide electrical connection for each detection element to a corresponding interconnect pad, and
wherein said solder bumps are electrically isolated from each other by the dielectric.

10. The assembly of claim 1 wherein said connection substrate supports at least one semiconductor detector array substrate having planar dimensions no larger than the planar dimensions of the connection substrate.

11. A method for making an x-radiation or gamma radiation detector array assembly that comprises the steps of:
providing a semiconductor detector array substrate comprising CdZnTe or CdTe having a plurality of metallized detector cell pads on a first surface thereof, said pads comprising a solderable metallization on a first surface thereof;
providing a connection substrate with circuit traces having a plurality of interconnect pads on a first surface thereof,
providing solder bumps with a melting point or liguidus less than 120 degrees C. at interconnect pads on the connection substrate first surface, at least a subset of the bumps corresponding to metallized pads on the semiconductor detector array substrate first surface,
mating the connection substrate first surface to the semiconductor detector array substrate first surface, wherein the solder bumps face towards and are aligned with their corresponding pads;
heating the combined unit, allowing sufficient time for at least a portion of the solder to melt and bond to the detector substrate, the bonding accomplished by aligning and contacting the discrete solder bumps to the metallized detector cell pads of the detector in the presence of a solder wetting promoter, followed by reflow of the solder without reflow of the metallization of the detector cell pads;
cooling to allow the solder to harden; and
providing an encapsulant such that the encapsulant provides mechanical strength and cures at a temperature sufficiently low to avoid damage to said substrate comprising CdZnTe or CdTe.

12. The method of claim 11 wherein said metallized detector cell pads further comprise a solder with a melting point or liquidus less than 120 degrees C.

13. The method of claim 11 wherein said encapsulant is introduced between the two first surfaces and cured at a temperature sufficiently low to avoid damage to said substrate comprising CdZnTe or CdTe, said encapsulant applied at least partially during said reflow.

14. The method of claim 11 wherein said encapsulant is introduced between the two first surfaces and cured at a temperature sufficiently low to avoid damage to said substrate comprising CdZnTe or CdTe, said encapsulant applied at least partially after said reflow.

15. The method of claim 13 wherein heating of the said combined unit and encapsulating resin proceeds sufficiently to fully harden.

16. The method of claim 13 wherein the resin includes at least one portion capable of remelt at a temperature below 120 degrees C. sufficiently to allow separation of the assembly after assembly and hardening, thereby permitting repair of the assembly without damage.

17. The method of claim 11, further comprising:
removing passivating oxides from the surface of the interconnect pads and solder bumps at a temperature no greater than 120 degrees C.

18. The method of claim 11 further comprising:
removing oxides from the surfaces of the interconnect pads and solder bumps with a solder wetting promoter comprising a curable fluxing agent; and
curing the fluxing agent, said fluxing agent at least partially curing at the same time as a process of reflowing the solder.

19. The method of claim 18 wherein said fluxing agent comprises a polymer that cures at a temperature no greater than 120 degrees C.

20. The method of claim 18 wherein said heating of the said combined unit and fluxing agent continues sufficiently to fully harden said fluxing agent.

21. The method of claim 18 wherein heating of the said combined unit melts the solder and simultaneously hardens the fluxing agent.

22. The method of claim 11 wherein said metallization of the detector cell pads comprises one or more layers of one selected from the list that includes Pt, Au, Al, Ni, Pd, and Ti.

23. The method of claim 11 wherein said metallization of the detector cell pads comprises one or more layers of metals selected from the list that includes Ni, Au, Ti, V, and Cu.

24. The method of claim 11 wherein said metallization of the detector cell pads further comprises a solder having a melting point or liquidus below 120 degrees C.

25. The method of claim 11 further comprising providing, for attachment to the connection substrate, at least one semiconductor detector array substrate having planar dimensions no larger than the planar dimensions of the connection substrate.

26. An x-radiation or gamma radiation detector assembly, comprising:
a semiconductor detector array substrate, comprising CdZnTe or CdTe, having a plurality of detector cell pads on a first surface thereof said pads comprising a contact metallization and a solder barrier metallization, solder of the solder barrier metallization having a melting point or liqiuidus less than 120 degrees C.; and
a ceramic or polymeric connection substrate, having a plurality of interconnect pads on a first surface thereof comprising one or more connectors for interconnecting the device to power, ground and other signal processing electronics.

27. An x-radiation or gamma radiation detector assembly, comprising:
a semiconductor detector comprising CdZnTe or CdTe that includes an array of detection elements; and
a plurality of solder bumps with a melting point or liqiuidus less than 120 degrees C. providing electrical connection for each detection element to a corresponding input contact pad on the top surface of a connection substrate with circuit traces,
wherein said solder bumps are electrically isolated from each other by a solid encapsulating material, and wherein the detection elements comprise electrodes on the lower surface of the detector, the electrodes comprising at least one solderability layer.

28. The detector assembly of claim 27, wherein the solid encapsulating material increases the mechanical strength of said solder bumps and provides mechanical stability to the assembly between said connection substrate top surface and the array of detection elements.

29. The detector assembly of claim 27, wherein the solid encapsulating material cures at a temperature sufficiently low to avoid damage to said substrate comprising CdZnTe or CdTe.

30. The detector assembly of claim 29, wherein the solid encapsulating material increases the mechanical strength of said solder bumps and provides mechanical stability to the assembly between said connection substrate top surface and the array of detection elements.

31. The detector assembly of claim 27 wherein said electrodes further comprise a contact metal layer directly on the detector surface and a barrier metallization layer.

32. The detector assembly of claim 31 wherein said contact metal layer comprises one selected from the list that includes Pt, Au, Al, Ni, Pd, and Ti.

33. The detector assembly of claim 31 wherein said barrier metallization layer comprises one or more selected from the list that includes Ni, Au, Ti, V, and Cu.

34. The detector assembly of claim 27, wherein said connection substrate with circuit traces comprises a ceramic or polymeric connection substrate which extends in at least one dimension beyond the semiconductor detector.

35. The detector assembly of claim 27 wherein said connection substrate supports at least one semiconductor detector array substrate having planar dimensions no larger than the planar dimensions of the connection substrate.

* * * * *